United States Patent [19]

Sun

[11] Patent Number: 6,143,601
[45] Date of Patent: Nov. 7, 2000

[54] METHOD OF FABRICATING DRAM

[75] Inventor: Shih-Wei Sun, Taipei, Taiwan

[73] Assignee: United Microelectronics Corp., Hsinchu, Taiwan

[21] Appl. No.: 09/208,714

[22] Filed: Dec. 9, 1998

[51] Int. Cl.[7] ............................................. H01L 21/8242
[52] U.S. Cl. .......................................................... 438/253
[58] Field of Search ................................... 438/250–266, 438/239–243; 365/149

[56] References Cited

U.S. PATENT DOCUMENTS 5,610,854   3/1997   Ema .................................... 365/149

*Primary Examiner*—Charles Bowers
*Assistant Examiner*—Craig Thompson
*Attorney, Agent, or Firm*—Hickman Coleman & Hughes, LLP

[57] ABSTRACT

A method of fabricating DRAM and embedded DRAM. A contact pad is formed in the periphery/logic circuitry region simultaneously with the formation of the bit line in the memory region. A metal-insulator-metal (MIM) capacitor structure is formed in the memory region by damascene, and a contact and a contact pad are formed in the periphery/logic circuitry region. The formation of the contact in the periphery/logic circuitry is formed step by step to lower the difficulty to fabricate the deep contact. The capacitor electrodes are made by metal layers, which can increase the capacitance of the capacitor.

18 Claims, 5 Drawing Sheets

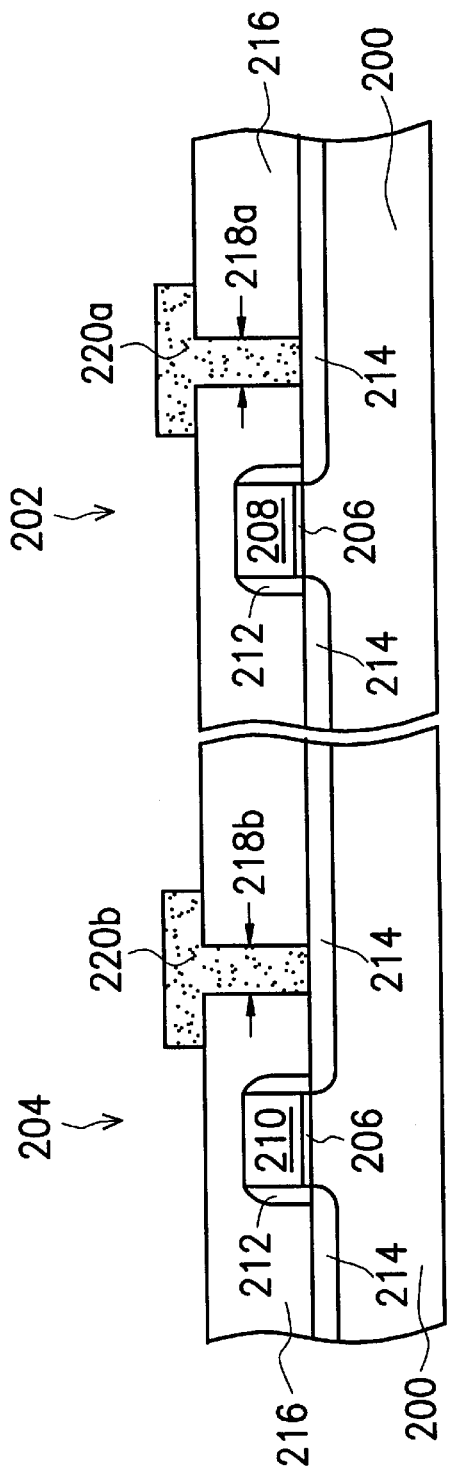
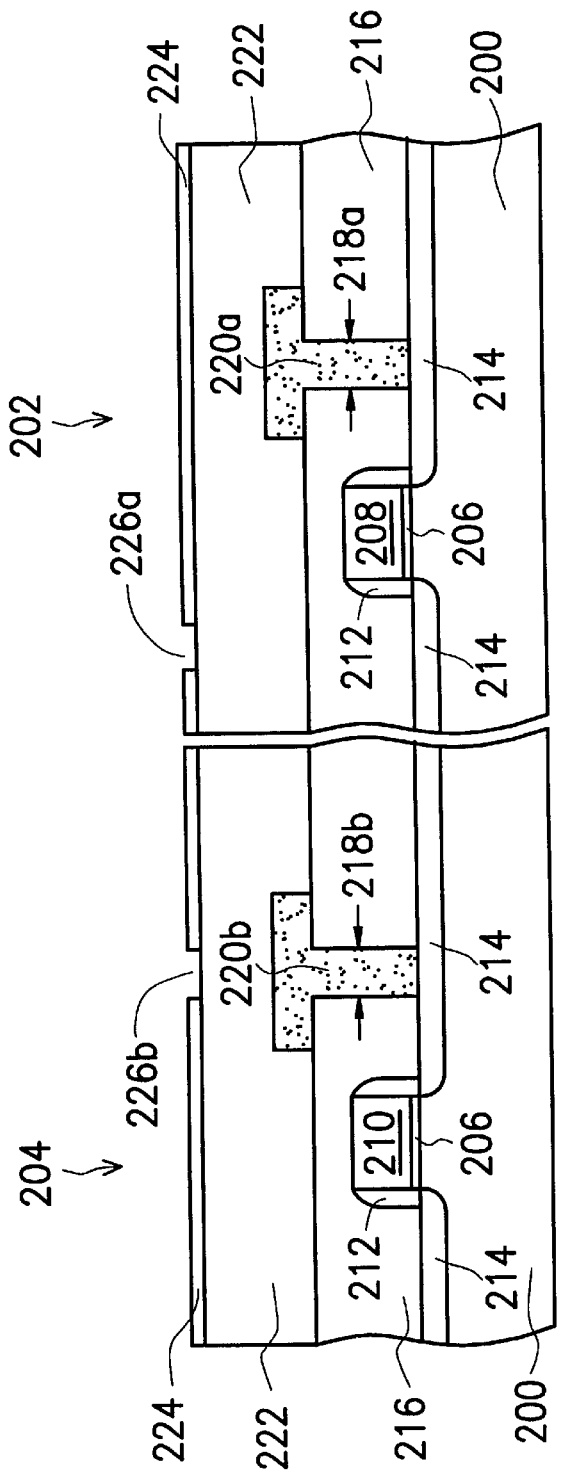
FIG. 2A
FIG. 2B

METHOD OF FABRICATING DRAM

BACKGROUND OF THE INVENTION

1. Field of the Invention

The invention relates to a method of fabricating an integrated circuit and more particularly to a method of fabricating a dynamic random access memory (DRAM) and an embedded DRAM.

2. Description of the Related Art

DRAM is a volatile memory, and the way to store digital signals is decided by charge or discharge of the capacitor in the DRAM. Therefore, when the power applied on the DRAM is turned off, the data stored in the memory cell completely disappears. One DRAM cell includes one field effect transistor (FET) and one capacitor. The capacitor is used to store the signals in the cell of DRAM. If more charges can be stored in the capacitor, the capacitor has less interference when the data is sensed by the amplifier.

FIG. 1 is a schematic, cross sectional view of a DRAM known in prior art. A memory region 100 and a periphery circuit region 102 are defined on a substrate 104. A word line 106 is formed on the substrate 104 in the memory region 100 and a gate 108 is simultaneously formed in the periphery circuit region 102. A source/drain region (not shown) is formed beside the gate 108 and the word line 106, such that a FET is formed in the periphery circuit region 100. A bit line 112 is then formed within a dielectric layer 110, which covers the word line 106 and gate 108. Dielectric layers 114, 118 are formed on the dielectric layer 110 and a capacitor 116 in the memory region 100 is formed therein. A contact 120 window in the periphery circuit region 102 is then formed by etching through the dielectric layers 118, 114. 112 and 110, and the depth of the contact window 120 is about 20000Å. A conductive layer then fills the contact window 120 to form a contact 122, and wiring lines 124 are formed on the dielectric layer 118 by circuitry layout.

As the dimension of the semiconductor device is reduced, an aspect ratio of the contact window 120 in the periphery circuit region 102 is therefore increased. The contact window 120 is too deep to cause difficulty for etching the dielectric layer 118, 114 and 110, and the dielectric layer 118, 114 and 110 may be not etched through. Thus the source/drain region (no shown) in the periphery circuit region 102 can not be completely exposed and a conductive layer subsequently deposited can not electrically connect to the source/drain region.

In addition, it is hard to deposit the conductive layer to fill the contact window 120 with a high aspect ratio and the performance of the device is therefore reduced.

The problem for etching the contact window in the periphery circuitry region of DRAM is also occurred in the logic circuitry region of an embedded DRAM. The aspect ratio of the contact window in the logic circuitry region is so high, such that the etching process to form the contact window is difficult to perform.

Otherwise, the material of the upper electrode and the lower electrode of the capacitor 116 is polysilicon layer. A depletion region is often produced between the polysilicon layer serving as electrodes and the capacitor dielectric layer due to compensation of electrons and holes. The thickness of the capacitor dielectric layer is therefore increased to cause charge storage decreasing and the performance of the capacitor is reduced.

SUMMARY OF THE INVENTION

It is therefore an object of the invention to provide a method of fabricating a DRAM and an embedded DRAM to reduce the aspect ratio of the contact window and the contact window can be easily formed.

It is therefore another object of the invention to form a metal-insulator-metal (MIM) capacitor in the memory region of DRAM and embedded DRAM to increase the capacitance of the capacitor.

To achieve these objects and advantages, and in accordance with the purpose of the invention, as embodied and broadly described herein, the invention is directed towards a method of fabricating a DRAM. A memory region and a periphery circuitry are defined on a substrate. A word line and a gate are formed on the substrate in the memory region and the periphery circuitry region. A first dielectric layer is formed on the substrate to cover the word line and the gate. A bit line is formed in the memory region and a contact pad is formed in the periphery circuitry region. A second dielectric layer is formed on the first dielectric layer to cover the bit line and the contact pad. An opening is formed within the first and the second dielectric layer in the memory region to expose the substrate by dual damascene and a contact window is also formed in the periphery circuitry region. A first defined metal layer is formed in the opening in the memory region to serve as a lower electrode of the capacitor and fills the opening to electrically connect to the substrate. The contact window in the periphery circuitry region is filled the defined metal layer to form a contact. A capacitor dielectric layer is formed on the lower electrode. A second defined metal layer serving as an upper electrode is formed on the capacitor dielectric layer, and a pad layer is formed on the contact.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 2A–2E are schematic, cross sectional view illustrating of fabrication of DRAM in a preferred embodiment according to the invention.

DESCRIPTION OF THE PREFERRED EMBODIMENTS

Figure 1:
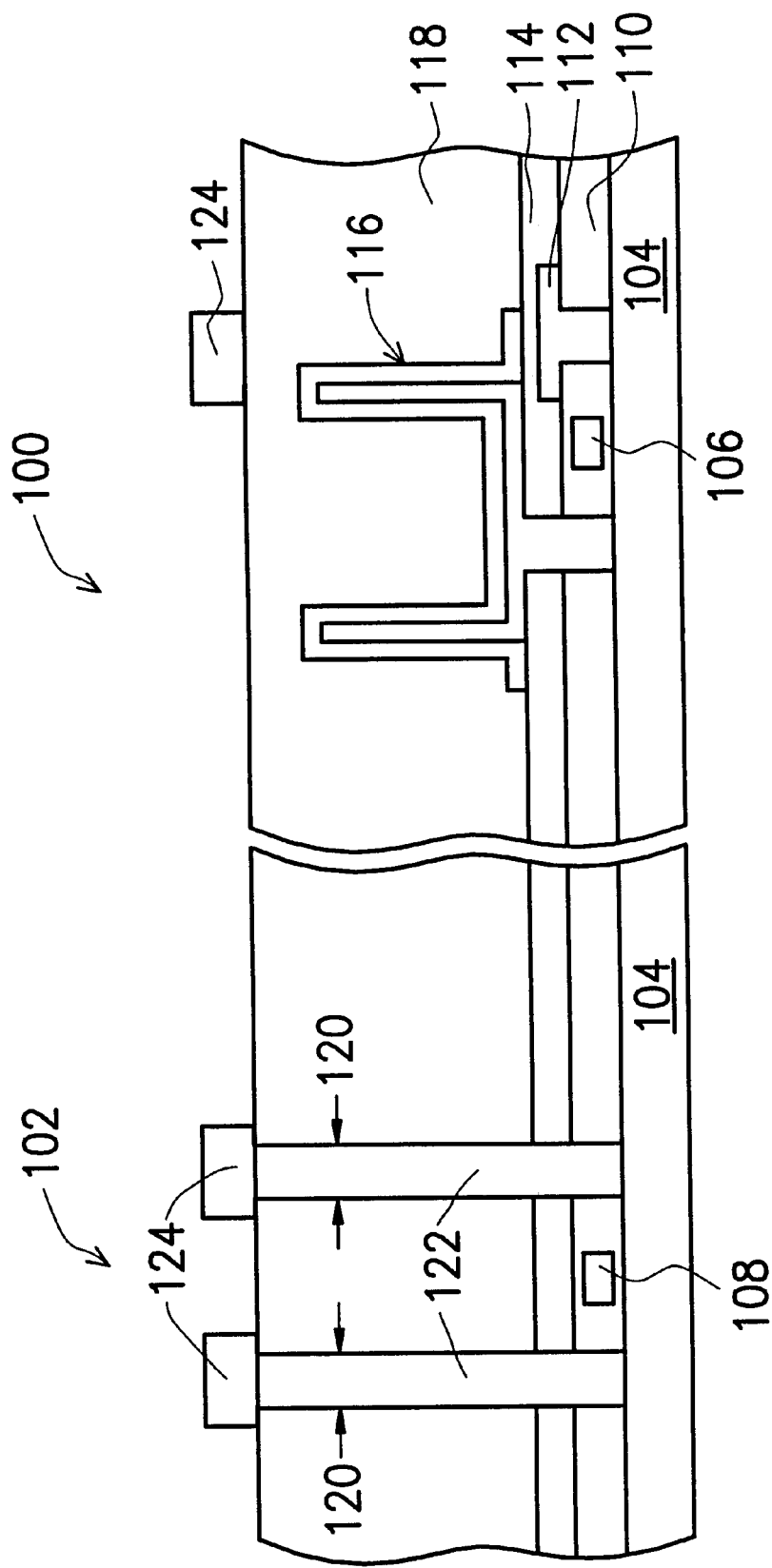
FIG. 1 is a schematic, cross sectional view of DRAM known in prior art.

Due to the formation of the capacitor in the memory region of DRAM in prior art, the dielectric layer in the periphery circuitry region is too thick to be etched through and as a result, the etching process for the contact window is difficult. In addition, a polysilicon layer is used to be the conductive material of the electrodes of the capacitor, and the thickness of the capacitor dielectric layer becomes thicker to cause capacitance of the capacitor reducing due to the depletion region. Therefore, it is need a method for fabricating a DRAM wherein a contact pad is formed in the periphery circuitry region to reduce the aspect ratio of the contact window. A MIM capacitor is provided in the memory region to increase the capacitance of the capacitor.

FIG. 2A–2E show a fabricating method of a DRAM in a preferred embodiment of this invention.

Referring to FIG. 2A, a memory region 202 and a periphery circuitry region 204 are defined on a substrate 200. A gate oxide layer 206 and a polysilicon layer are successively formed on the substrate 200. The gate oxide layer 206 and the polysilicon layer are defined to form a word line 208 in the memory region 202 and to form a gate 210 in the periphery circuitry region 204. Spacers 212 are formed on the sidewall of the word line 208 and gate 210 to protect thereof. A source/drain region 214 is formed in the substrate 200 beside the word line 208 and the gate 210.

As shown in FIG. 2A, a dielectric layer 216 such as silicon oxide layer is formed on the substrate 200 to cover the word line 208 and the gate 210. The dielectric layer 216 is patterned by photolithography, and a bit line contact window 218a and a contact pad opening 218b are respectively formed within the dielectric layer 216 of the memory region 202 and the periphery circuitry region 204 to expose the source/drain region 214. A conductive layer such as metal layer, silicide or tungsten silicide is formed on the dielectric layer 216. The conductive layer fills the bit line contact window 218a and the contact pad opening 218b, and then is patterned to form a bit line 220a and a contact pad 220b in the memory region 202 and the periphery circuitry region 204.

Referring to FIG. 2B, a dielectric layer 222 is formed on the dielectric layer 216 to cover the bit line 220a and the contact pad 220b. The dielectric layer 222 includes a silicon oxide layer, which is formed by CVD. A hard material layer 224 such as silicon nitride layer is formed on the dielectric layer 222. The hard material layer 224 is then defined and an opening 226a, 226b is formed within the hard material layer 224 in the memory region 202 and the periphery circuitry region 204.

Figure 2C:
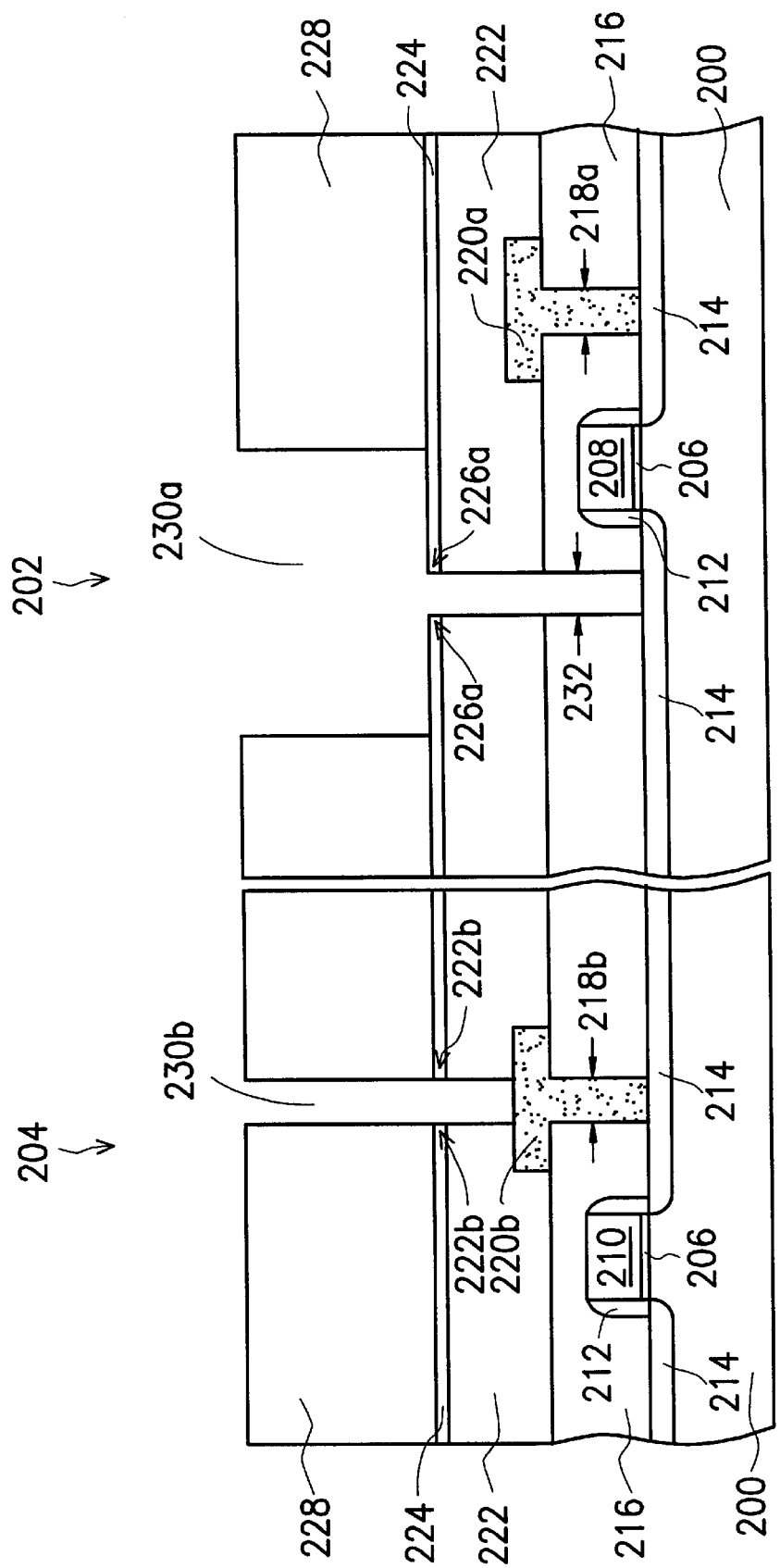

Referring to FIG. 2C, a dielectric layer 228 is then formed on the hard material layer 224. The dielectric layer 228 are patterned and etched and using the hard material layer to serve as a stop layer, openings 230a, 230b are formed on the openings 226a, 226b within the dielectric layer 228 in the memory region 202 and the periphery circuitry region 204 to expose the hard material layer 224. Since the opening 226 within the hard material layer 224 are not covered by the hard material layer 224, the dielectric layers 222, 216 are etched through while etching the dielectric layer 228. Therefore, an opening 230a having a wider upper portion and a narrower lower portion is formed by method of dual damascene and the source/drain region 214 is exposed. The opening 232 within the dielectric layers 222, 216 serves as a node contact window. A contact window 230b is formed in the periphery circuitry region 204 to expose the contact pad 220b when the opening 230a in the memory region 230a is formed.

Figure 2D:
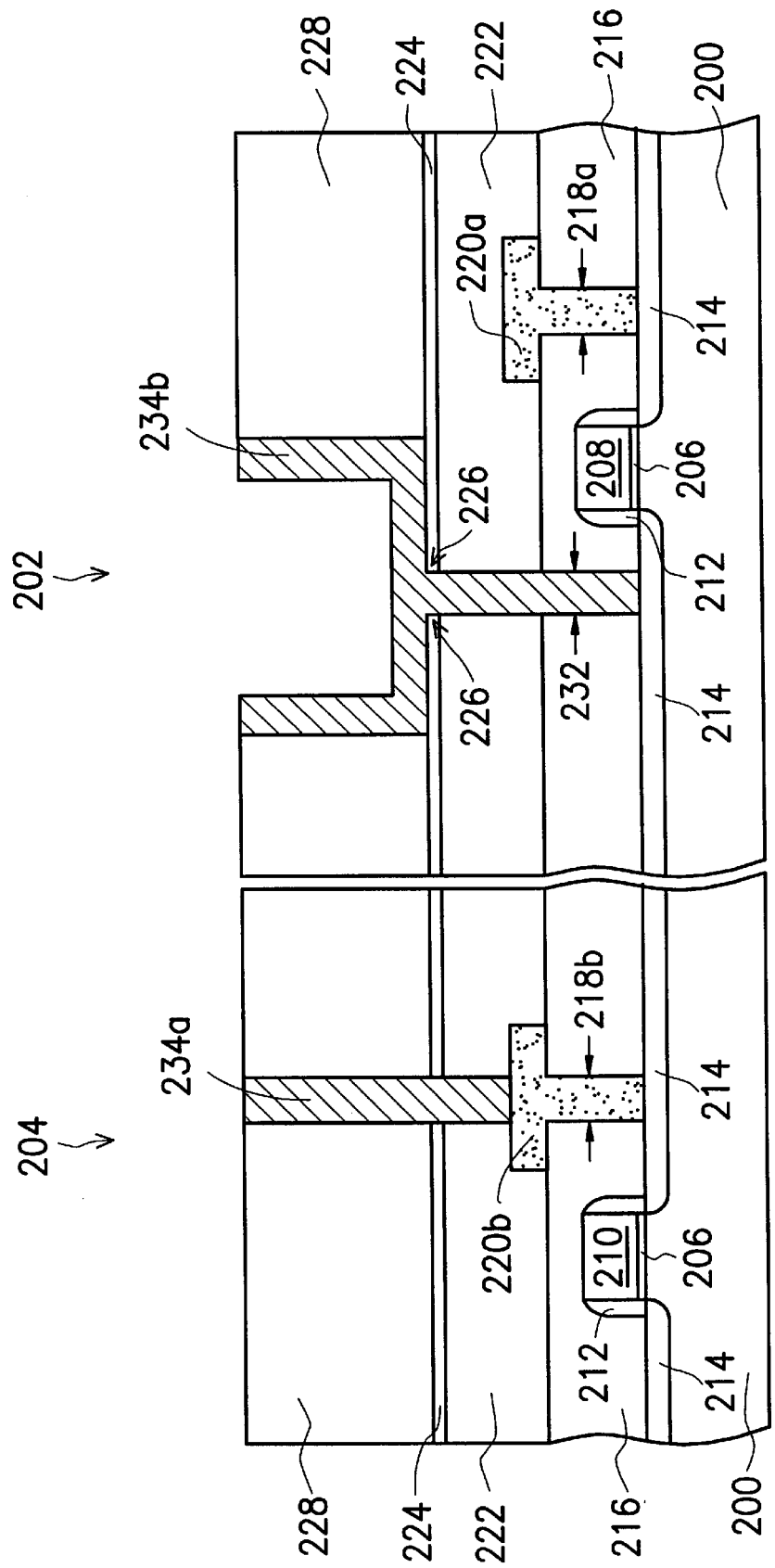

A metal layer such as tungsten is formed in the opening 230a and contact window 230b in FIG. 2C. The metal layer 234a fills the node contact window 232 and covers the hard material layer 224. The metal layer 234a in the memory region 202 is patterned and serves as a lower electrode of the capacitor, as shown in FIG. 2D, wherein the pattern of the lower electrode is decided by layout. The metal layer 234b to fill in the contact window 230b serves as a contact.

Figure 2E:
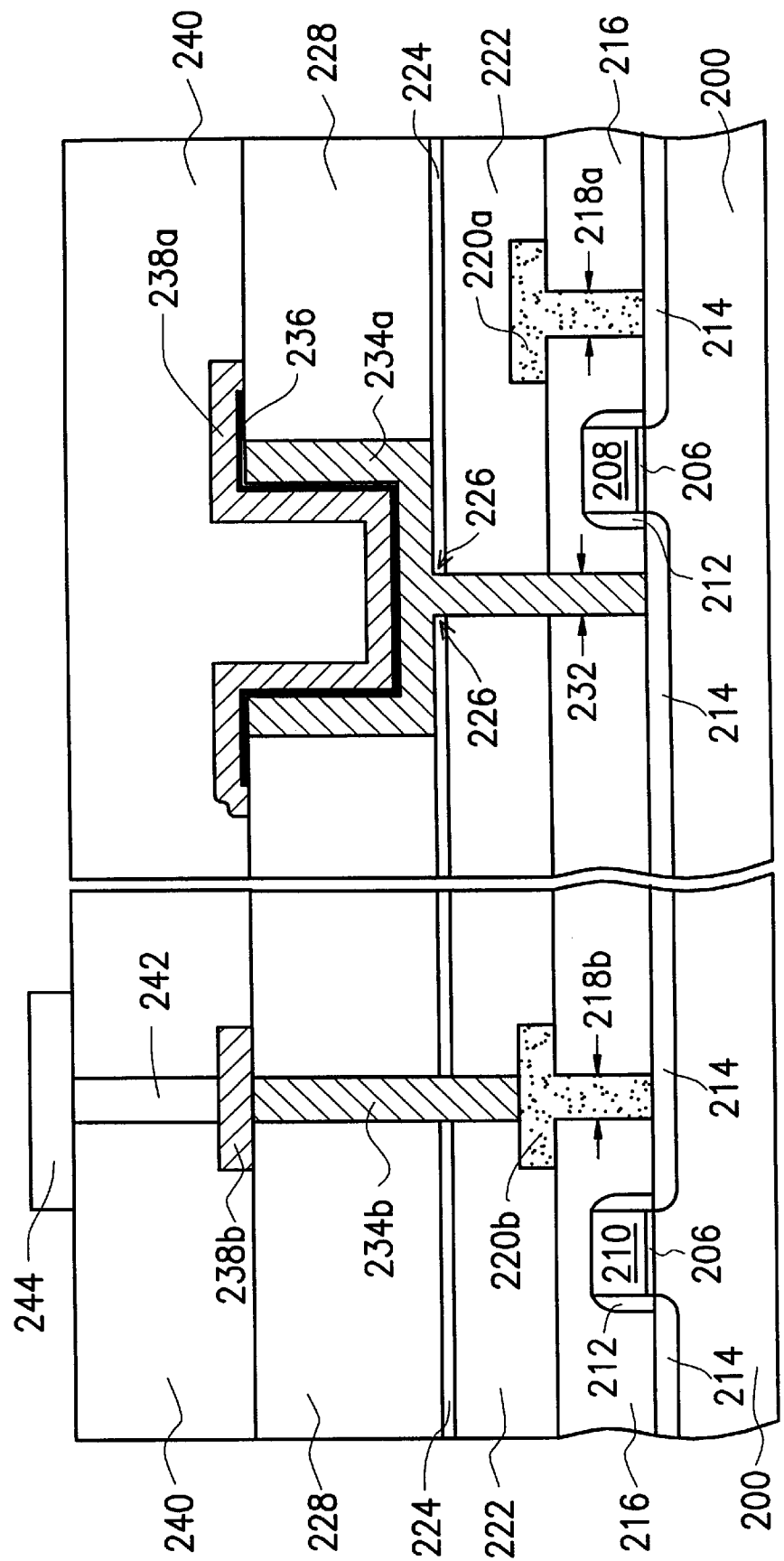

Referring to FIG. 2E, a defined capacitor dielectric layer 236 including $Ta_2O_5$, BST or NO is formed on the metal layer 234a in the memory region 202. A metal layer is formed on the dielectric layer 228 and then patterned to serve as an upper electrode 238a of the capacitor in the memory region 202. The formation and definition of the metal layer are performed in the periphery circuitry 204 and a metal pad 238b is formed on the contact 234. A dielectric layer 240 is then formed on the dielectric layer 228 to cover the metal layer 238a, 238b and a via hole is formed within the dielectric layer 240 after planarizing the dielectric layer 240. The via hole is filled with a conductive layer to form a via 242. A defined conductive layer is then formed on the via to serve as wiring line 244 subsequently.

In this invention, a contact pad 220b is provided in the periphery region 204 when the bit line 220a is formed in the memory region 202 and as a result, the etching depth for the contact window in the periphery circuitry 204 is therefore reduced. The etching process for the contact window becomes easier than that in prior art. In addition, the capacitor in the memory region 202 is formed by dual damascene and the process of the contact 234b can be performed while the upper 234a and lower electrode 238a are formed. Such that the problem that the dielectric layer is too thick to be etched through can be overcome. The material of the electrodes is metal layer so that the capacitance of the capacitor can be enhanced.

The problem occurred in the periphery circuitry region of DRAM is also happened in the logic circuitry region of the embedded DRAM. Therefore, the method provided in this invention is suitable for the embedded DRAM to solve the problem of the contact window with a high aspect ratio in the logic circuitry region.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a DRAM wherein a substrate having a memory region and a periphery circuitry region is provided and a first dielectric layer is formed thereon, comprising the steps of:

forming a bit line in the memory region and forming a contact pad in the periphery circuitry region;

forming a second dielectric layer on the first dielectric layer;

forming an opening having a wider upper portion and a narrower lower portion within the first and the second dielectric layer in the memory region to expose the substrate and forming a contact opening in the periphery circuitry region to expose the contact pad;

forming a lower electrode of a capacitor on the opening in the memory region and forming a contact in the contact opening;

forming a capacitor dielectric layer on the lower electrode; and forming an upper electrode of the capacitor on the capacitor dielectric layer and forming a metal pad on the contact in the periphery circuitry region.

2. A method of fabricating a DRAM wherein a substrate having a memory region and a periphery circuitry region is provided, a word line and a gate are formed thereon in the memory region and the periphery circuitry region respectively, and a first dielectric layer is formed on the substrate to cover the word line and the gate, comprising the steps of:

forming a bit line in the memory region and forming a contact pad in the periphery circuitry region;

forming a second dielectric layer on the first dielectric layer;

forming an opening having a wider upper portion and a narrower lower portion within the first and the second dielectric layer in the memory region to expose the substrate and forming a contact opening in the periphery circuitry region to expose the contact pad;

forming a patterned first metal layer on the second dielectric layer wherein the first metal layer on the opening in the memory region serves as a lower electrode of a capacitor and the metal layer filled in the contact window in the periphery circuitry region serves as a contact;

forming a capacitor dielectric layer on the lower electrode; and forming a patterned second metal layer on the second metal layer wherein the second metal layer on the capacitor dielectric layer serves as an upper electrode of the capacitor and the second metal layer on the contact serves as a metal pad.

3. The method according to claim 2, wherein the step of forming a bit line in the memory region and forming a contact pad in the periphery circuitry region further comprises forming a bit line contact window in the memory region and forming a contact pad opening in the periphery circuitry by patterning the first dielectric layer;

forming a conductive layer on the first dielectric layer; and forming the bit line in the memory region and forming the contact pad in the periphery circuitry region by patterning the conductive layer.

4. The method according to claim 3, wherein the conductive layer includes a metal layer.

5. The method according to claim 2, wherein the first metal layer includes tungsten.

6. The method according to claim 2, wherein the capacitor dielectric layer includes $Ta_2O_5$.

7. A method of fabricating an embedded DRAM wherein a substrate having a memory region and a periphery circuitry region is provided, a word line and a gate are respectively formed thereon in the memory region and the periphery circuitry region, and a insulated layer is formed on the substrate to cover the word line and the gate, comprising the step of:

forming a bit line within the insulated layer in the memory region and forming a contact pad in the periphery circuitry region;

forming a first dielectric layer on the insulated layer;

forming a hard material layer having a first opening and a second in the memory region and the periphery circuitry region on the first dielectric layer;

forming a second dielectric layer on the hard material layer;

forming a third opening on the first opening in the memory region to expose the substrate and the hard material layer to form a node contact window within the first dielectric layer and the insulated layer, and forming a contact opening in the periphery circuitry region to expose the contact pad;

forming a patterned first metal layer on the second dielectric layer wherein the first metal layer on the opening in the memory region serves as a lower electrode of a capacitor and the metal layer filled in the contact window in the periphery circuitry region serves as a contact;

forming a capacitor dielectric layer on the lower electrode; and forming a patterned second metal layer on the second metal layer wherein the second metal layer on the capacitor dielectric layer serves as an upper electrode of the capacitor and the second metal layer on the contact serves as a metal pad.

8. The method according to claim 7, wherein the bit line and the contact pad includes tungsten silicide.

9. The method according to claim 7, wherein the hard material layer includes silicon nitride.

10. The method according to claim 7, wherein the first metal layer includes tungsten.

11. The method according to claim 7, wherein the capacitor dielectric layer includes $Ta_2O_5$.

12. The method according to claim 7, wherein the step of forming a bit line in the memory region and forming a contact pad in the periphery circuitry region further comprises forming a bit line contact window in the memory region and forming a contact pad opening in the periphery circuitry by patterning the insulated layer;

forming a conductive layer on the insulated layer; and forming the bit line in the memory region and forming the contact pad in the periphery circuitry region by patterning the conductive layer.

13. A method of fabricating an embedded DRAM wherein a substrate having a memory region and a logic circuitry region is provided, a word line and a gate are respectively formed thereon in the memory region and the logic circuitry region, and a insulated layer is formed on the substrate to cover the word line and the gate, comprising:

forming a bit line within the insulated layer in the memory region and forming a contact pad in the logic circuitry region;

forming a first dielectric layer on the insulated layer;

forming a hard material layer having a first opening and a second opening in the memory region and the logic circuitry region on the first dielectric layer;

forming a second dielectric layer on the hard material layer;

forming a third opening on the first opening in the memory region to expose the substrate and the hard material layer to form a node contact window within the first dielectric layer and the insulated layer, and forming a contact opening in the logic circuitry region to expose the contact pad;

forming a patterned first metal layer on the second dielectric layer wherein the first metal layer on the opening in the memory region serves as a lower electrode of a capacitor and the metal layer filled in the contact window in the logic circuitry region serves as a contact;

forming a capacitor dielectric layer on the lower electrode; and forming a patterned second metal layer on the second metal layer wherein the second metal layer on the capacitor dielectric layer serves as an upper electrode of the capacitor and the second metal layer on the contact serves as a metal pad.

14. The method according to claim 13, wherein the bit line and the contact pad includes tungsten silicide.

15. The method according to claim 13, wherein the hard material layer includes silicon nitride.

16. The method according to claim 13, wherein the first metal layer includes tungsten.

17. The method according to claim 13, wherein the capacitor dielectric layer includes $Ta_2O_5$.

18. The method according to claim 13, wherein forming a bit line in the memory region and forming a contact pad in the logic circuitry region further comprises forming a bit line contact window in the memory region and forming a contact pad opening in the logic circuitry by patterning the insulated layer;

forming a conductive layer on the insulated layer; and forming the bit line in the memory region and forming the contact pad in the logic circuitry region by patterning the conductive layer.

* * * * *